(12) United States Patent
Maeda

(10) Patent No.: US 8,477,870 B2
(45) Date of Patent: Jul. 2, 2013

(54) TRANSMITTER INCLUDING POLAR MODULATION CIRCUIT

(75) Inventor: Masakatsu Maeda, Osaka (JP)

(73) Assignee: Panasonic Corporation, Osaka (JP)

( * ) Notice: Subject to any disclaimer, the term of this patent is extended or adjusted under 35 U.S.C. 154(b) by 30 days.

(21) Appl. No.: 13/380,947

(22) PCT Filed: Apr. 9, 2010

(86) PCT No.: PCT/JP2010/002594
§ 371 (c)(1),
(2), (4) Date: Dec. 27, 2011

(87) PCT Pub. No.: WO2011/001577
PCT Pub. Date: Jan. 6, 2011

(65) Prior Publication Data
US 2012/0105111 A1    May 3, 2012

(30) Foreign Application Priority Data
Jul. 2, 2009 (JP) .................................. 2009-158099

(51) Int. Cl.
*H04L 27/00* (2006.01)
(52) U.S. Cl.
USPC ........... 375/295; 375/130; 375/135; 375/146; 375/267; 375/271; 375/297; 375/300; 375/302
(58) Field of Classification Search
USPC ............... 375/295, 130, 135, 146, 267, 271, 375/297, 300, 302; 327/101, 291; 332/106; 341/20, 173
See application file for complete search history.

(56) References Cited

U.S. PATENT DOCUMENTS

| 8,126,409 | B2 * | 2/2012 | Osman et al. ................. 455/102 |
| 2005/0245208 | A1 | 11/2005 | Udagawa et al. | |
| 2006/0234652 | A1 | 10/2006 | Oka | |
| 2006/0246856 | A1 * | 11/2006 | Udagawa et al. ............. 455/108 |
| 2007/0104260 | A1 | 5/2007 | Ichiyama et al. | |

FOREIGN PATENT DOCUMENTS

| JP | 2005-57665 | 3/2005 |
| JP | 2005-287011 | 10/2005 |
| JP | 2007-127645 | 5/2007 |
| JP | 2008-48052 | 2/2008 |
| WO | 2006/101094 | 9/2006 |

OTHER PUBLICATIONS

International Search Report issued May 11, 2010 in corresponding International Application No. PCT/JP2010/002594.

\* cited by examiner

*Primary Examiner* — Dhaval Patel
(74) *Attorney, Agent, or Firm* — Wenderoth, Lind & Ponack, L.L.P.

(57) ABSTRACT

Provided is a transmitter including a polar modulation circuit which adjusts a timing lag between an amplitude component and a phase component more accurately than a conventional art. The polar modulation circuit includes: a first calculator for performing an exclusive OR logical operation between the amplitude component before and after being inputted to the first processing section; a second calculator for performing an exclusive OR logical operation between the phase component before and after being inputted to the second processing section; and a delay fluctuation detection/compensation section for obtaining a delay time of the amplitude component based on an amount of output accumulation of the first calculator; obtaining a delay time of the phase component based on an amount of output accumulation of the second calculator; detecting an amount of delay fluctuation by using the delay times; and adjusting timings of the amplitude component and the phase component.

9 Claims, 8 Drawing Sheets

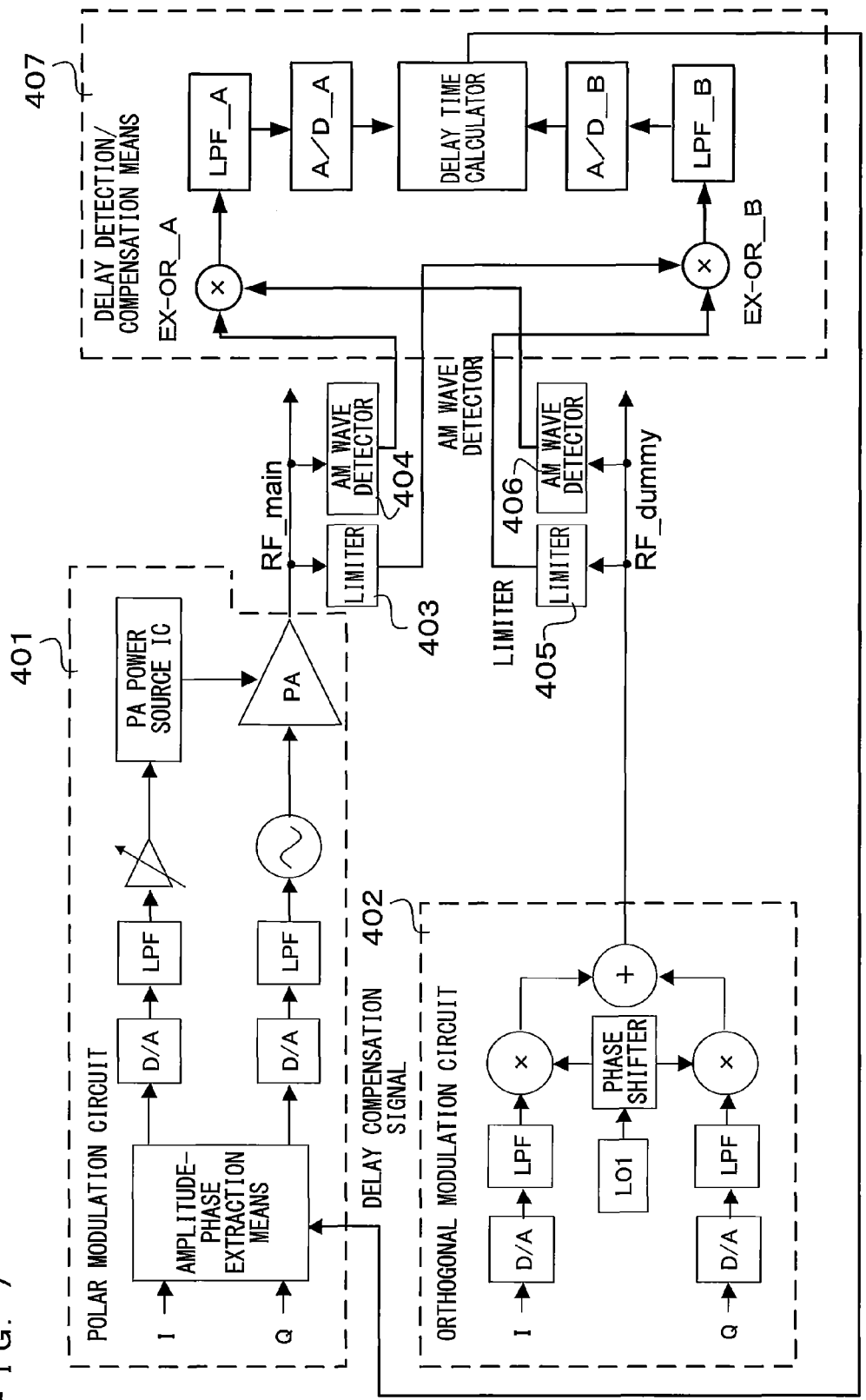
F I G. 7

TRANSMITTER INCLUDING POLAR MODULATION CIRCUIT

TECHNICAL FIELD

The present invention relates to transmitters employing polar modulation, and more particularly to a technology that compensates group delay variation between AM-PM at a time of polar modulation.

BACKGROUND ART

Recent rapid diffusion of mobile phones is remarkable, and various technologies have been proposed for reducing cost and increasing battery life.

For example, polar modulation which separately processes an amplitude component (AM) and a phase component (PM) does not require a power amplifier with high linearity. Thus, lower cost and lower power consumption can be expected to be realized for a function of transmitter for mobile phones and the like.

Patent literature 1 is an example of a conventional transmitter employing polar modulation.

CITATION LIST

Patent Literature

[PTL 1] Japanese Laid-Open Patent Publication No. 2008-48052

SUMMARY OF THE INVENTION

Problems to be Solved by the Invention

Polar modulation synthesizes an amplitude component signal and a phase component signal having been separately processed. Consequently, it is required to accurately adjust a timing lag between the amplitude component and the phase component. For example, a timing lag due to individual characteristic differences of components can be adjusted based on measured values of inputs of test signals and the like at a time of factory shipment. However, an amount of lag between an amplitude component and a phase component fluctuates, to an extent that cannot be disregarded, due to a surrounding temperature, a pattern, a level, and the like of an input signal. Thus, some measure has to be taken.

Therefore, an objective of the present invention is to provide a transmitter including a polar modulation circuit which can adjust a time lag between an amplitude component and a phase component during polar modulation more accurately than a conventional art, thereby increasing transmission accuracy and efficiency.

Solution to the Problems

The present invention is directed to a transmitter including a polar modulation circuit. In order to solve the above problems, the transmitter of the present invention includes a polar modulation circuit configured with: an extraction section, a first processing section, a second processing section, an amplifier, a first calculator, a first accumulation section, a second calculator, a second accumulation section, and a delay fluctuation detection/compensation section. The extraction section extracts an amplitude component and a phase component separately from an input signal. The first processing section performs a first signal process which causes a delay on the amplitude component extracted by the extraction section. The second processing section performs a second signal processing which causes a delay on the phase component extracted by the extraction section. The amplifier synthesizes an output of the first processing section and an output of the second processing section and amplifies the synthesized outputs to generate an output signal. The first calculator performs an exclusive OR logical operation between the amplitude component before being inputted to the first processing section and the amplitude component after having been inputted to the first processing section. The first calculator accumulates outputs for a predetermined time period. The second calculator performs an exclusive OR logical operation between the phase component before being inputted to the second processing section and the phase component after having been inputted to the second processing section. The second calculator accumulates outputs for a predetermined time period. The delay fluctuation detection/compensation section obtains a delay time of the amplitude component based on an amount of accumulation of the first accumulation section; obtains a delay time of the phase component based on an amount of accumulation of the second accumulation section; detects an amount of delay fluctuation by using the delay times; and adjusts timings of the amplitude component and the phase component before being synthesized by the amplifier.

Preferably, the polar modulation circuit may further include substantially equivalent limiter amplifiers which respectively set upper limits on the amplitude for every two inputs of the first calculator and every two inputs of the second calculator.

Preferably, the polar modulation circuit may further include substantially equivalent filters which remove small pulses that may cause an error for every two inputs of the first calculator and for every two inputs of the second calculator Preferably, the polar modulation circuit may further include a first counter for counting a number of pulses of an output of the first calculator; and a second counter for counting a number of pulses of an output of the second calculator, and the delay fluctuation detection/compensation section, at a time of obtaining a delay time of the amplitude component, divides an output of the first accumulation section by the number of pulses counted by the first counter, and at a time of obtaining a delay time of the phase component, divides an output of the second accumulation section by the number of pulses counted by the second counter.

Preferably, the first accumulation section may accumulate outputs of the first calculator until the number of pulses counted by the first counter reaches a first predetermined number, and the second accumulation section may accumulate outputs of the second calculator until the number of pulses counted by the second counter reaches a second predetermined number.

Preferably, the first accumulation section and the second accumulation section are a low pass filter circuit including a capacitor and a resistance, and an output Vout 1 of the first accumulation section is represented by:

$$V\text{out}1 = \{(2\Delta T1)/T\text{sig\_ave}1\} \times VDD1 \qquad \text{formula 1-1}$$

$$T\text{sig\_ave}1 = T\text{measure}1/(\text{number of pulses of amplitude component}/2) \qquad \text{formula 1-2}$$

here, $\Delta T1$ is a pulse width of the amplitude component that corresponds to a delay time, Tsig_ave1 is an average of the amplitude component during one cycle, VDD1 is a pulse height of the amplitude component,
Tmeasure1 is an accumulation time period, and
an output Vout2 of the second accumulation section is represented by:

$$Vout2=\{(2\Delta T2)/Tsig\_ave2\}\times VDD2 \qquad \text{formula 2-1}$$

$$Tsig\_ave2=Tmeasure2/(\text{number of pulses of phase component}/2) \qquad \text{formula 2-2}$$

here, $\Delta T2$ is a pulse width of the phase component that corresponds to a delay time,
Tsig_ave2 is an average of the phase component during two cycles,
VDD2 is a pulse height of the phase component,
Tmeasure2 is an accumulation time period, and
the delay fluctuation detection/compensation section: obtains $\Delta T1$ from formula 1-1 and formula 1-2 and thereby obtains a delay time of the amplitude component; and obtains $\Delta T2$ from formula 2-1 and formula 2-2 and thereby obtains a delay time of the phase component.

Preferably, the first accumulation section and the second accumulation section are each an integrator, and the first accumulation section and the second accumulation section are each an integrator, and
an output Vout 1 of the first accumulation section is represented by:

$$Vout1=-\{1/(C\times R)\}\times(\text{number of pulses of amplitude component}\times\Delta T1\times VDD1) \qquad \text{formula 1}$$

here, $\Delta T1$ is a pulse width of the amplitude component that corresponds to a delay time,
VDD1 is a pulse height of the amplitude component,
C is a capacity of the capacitor in the integrator,
R is a resistance value in the integrator, and
an output Vout2 of the second accumulation section is represented by:

$$Vout2=-\{1/(C\times R)\}\times(\text{number of pulses of amplitude component}\times\Delta T2\times VDD2) \qquad \text{formula 2}$$

here, $\Delta T2$ is a pulse width of the amplitude component that corresponds to a delay time,
VDD2 is a pulse height of the amplitude component,
C is a capacity of the capacitor in the integrator, and
R is a resistance value in the integrator, and
the delay fluctuation detection/compensation section: obtains $\Delta T1$ from formula 1 and thereby obtains a delay time of the amplitude component; and obtains $\Delta T2$ from formula 2 and thereby obtains a delay time of the phase component.

Preferably, the transmitter may further include another modulation circuit which: modulates an I signal and a Q signal without separating an amplitude component signal and a phase component signal; generates a modulation signal that does not cause a lag between the amplitude component and the phase component; and provides the modulation signal as an input signal to the polar modulation circuit.

Preferably, the transmitter may further include another modulation circuit which: modulates an I signal and a Q signal without separating an amplitude component signal and a phase component signal; generates a modulation signal that does not cause a lag between the amplitude component and the phase component; extracts the amplitude component and the phase component separately from the modulation signal; provides the extracted amplitude component to replace with a signal yet to be inputted to the first processing section in the first calculator; and provides the extracted phase component to replace with a signal yet to be inputted to the second processing section in the second calculator.

Advantageous Effects of the Invention

As described above, according to the present invention, while transmission is performed normally, respective delay times of an amplitude component and phase component are measured and a timing lag between the amplitude component and the phase component can be adjusted. Accordingly, without separately considering an amount of lag due to individual characteristic differences of components and an amount of fluctuation due to various causes such as surrounding temperature and a pattern, level, and the like of input signal, the timing lag can be accurately adjusted in real time. Further, error causes can be removed by providing a limiter amplifier and filters for every input of each calculation means, thereby increasing measurement accuracy. Furthermore, measurement errors due to the pattern of input signal can be removed by counting a number of pulses of an output of each calculator and dividing an output of a corresponding accumulation section by the counted number of pulses, thereby increasing measurement accuracy.

BRIEF DESCRIPTION OF THE DRAWING

FIG. 7 is a schematic figure illustrating a periphery of a polar modulation circuit of a transmitter 400 according to a fourth embodiment of the present invention.

DESCRIPTION OF EMBODIMENTS

First Embodiment

<Outline>

A transmitter of a first embodiment measures an amount of lag between an amplitude component and a phase component during polar modulation and compensates the amount of lag. First, by using a measuring principle described below, each of a delay time of amplitude component and a delay time of phase component are obtained based on an input and an output of signal processing in which a delay is caused. Subsequently, a difference between the delay time of amplitude component and the delay time of phase component is obtained, the difference is compared with a reference value, and an amount of delay fluctuation is detected. Then, based on the detected amount of fluctuation, timings of the amplitude component and the phase component are adjusted.

<Details of Measuring Method>

First, the measuring method used in the present embodiment will be described.

When an original signal is denoted as Sin(ωt) and a signal which is delayed is denoted as Sin(ωt+Φ), a calculation result Y(t) obtained by multiplying Sin(ωt) by Sin(ωt+Φ) is represented by (formula 1) below.

$$Y(t)=\mathrm{Sin}(\omega t)\times\mathrm{Sin}(\omega t+\Phi)=-(1/2)\{\mathrm{Cos}(2\omega t+\Phi)-\mathrm{Cos}(\Phi)\} \quad \text{(formula 1)}$$

According to (formula 1), Y(t) contains Cos(Φ) of a D/C component. Thus, by monitoring the DC component, fluctuation of delay time can be detected.

Figure 1:
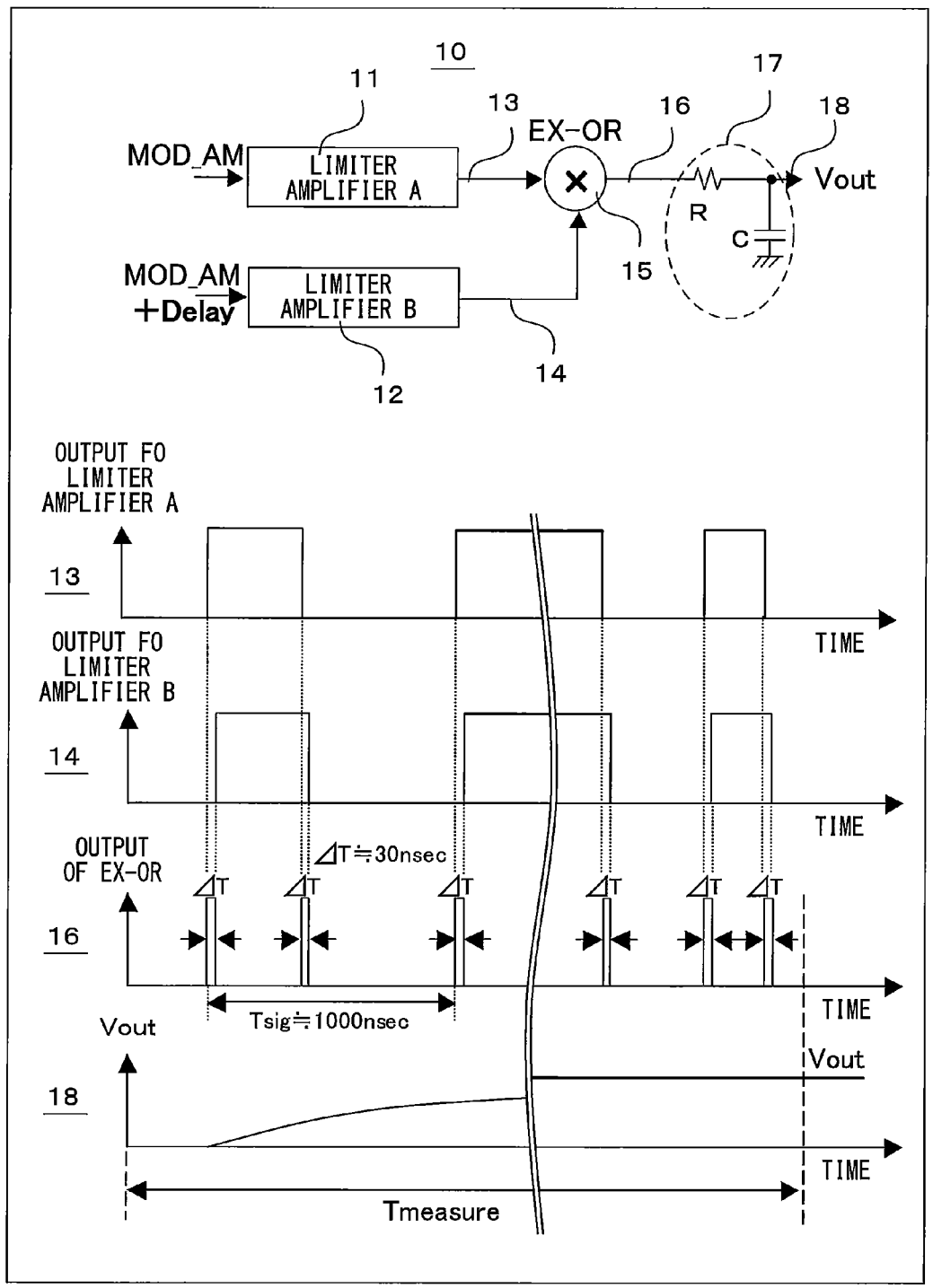
FIG. 1 is a schematic diagram illustrating a configuration example of a delay time measurement device 10 which outputs, based on an original signal and a signal which is delayed, a voltage corresponding to a delay time, and illustrating a problem in the actual implementation.

FIG. 1 is a schematic diagram illustrating configuration example of a delay time measurement device 10 which outputs, based on an original signal and a signal which is delayed, a voltage corresponding to a delay time, and illustrating a problem in the actual implementation.

In FIG. 1, limiter amplifiers 11, 12 have the same characteristics. The limiter amplifier 11 receives test transmission data "MOD_AM" which is not delayed and obtains a limiter amplifier output 13 with an even wave height. The limiter amplifier 12 receives test transmission data "MOD_AM+Delay" which is delayed and obtains a limiter amplifier output 14 with an even wave height. An exclusive OR operation unit 15 ("EX-OR" in FIG. 1) receives the limiter amplifier outputs 13, 14, performs an exclusive OR logical operation on the limiter amplifier outputs 13, 14, and outputs an output voltage 16. The output voltage 16 is time-averaged by a low pass filter 17 constituted of a CR and an average voltage 18 ("Vout" in FIG. 1) is outputted. Here, if a number of pulses per unit time of the limiter amplifier output 13 or the limiter amplifier output 14 and a wave height of the output voltage 16 are known, a delay time can be obtained easily from the average voltage 18.

At this time, the low pass filter 17 may remove a high frequency component, "Cos(2ωt+Φ)" and leave the DC component, "−Cos(Φ)" as it is in the (formula 1).

In order to verify a relationship between a delay time and an output voltage, an actual simulation result will be described.

Figure 2:
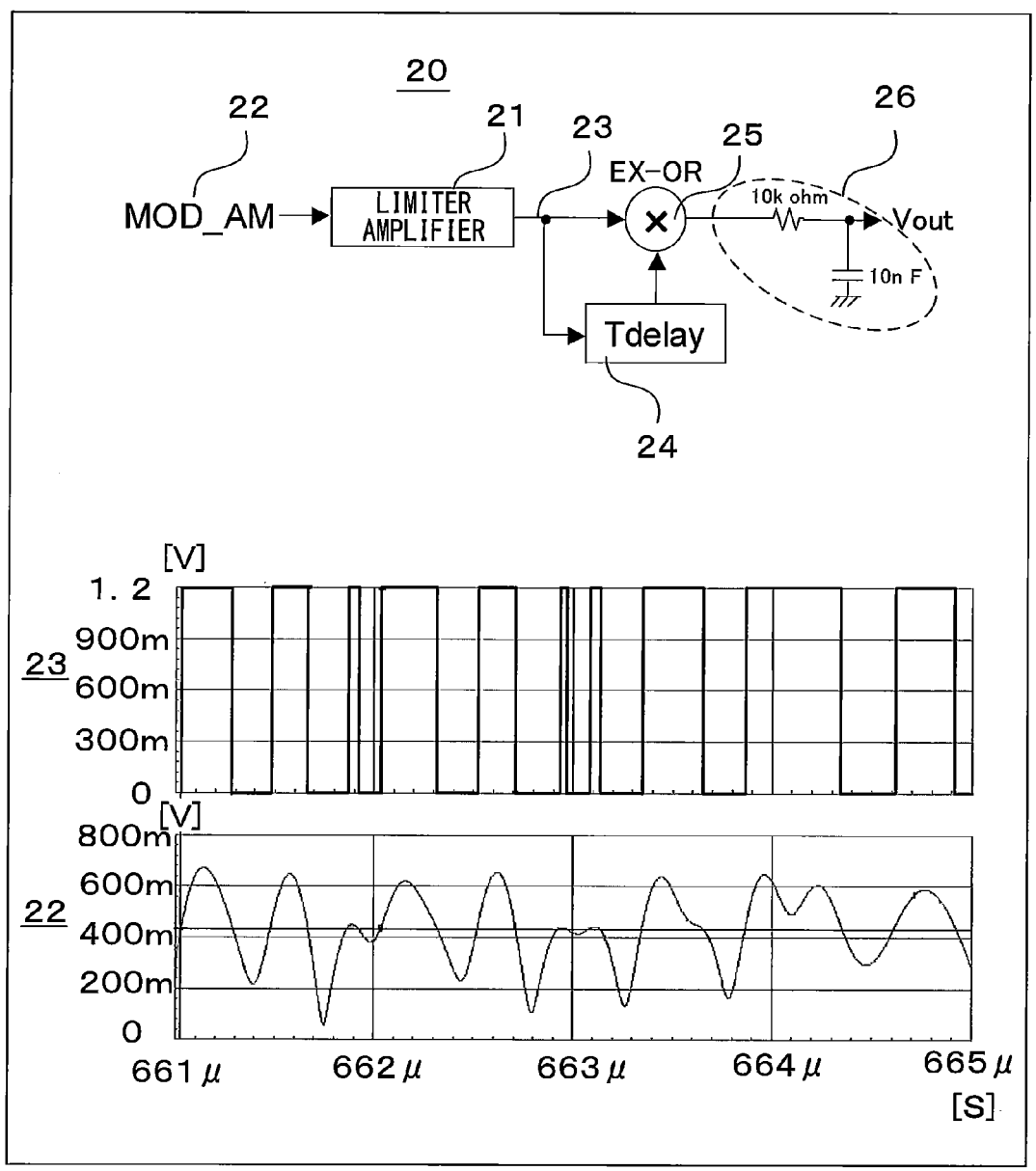
FIG. 2 is a schematic diagram of a configuration of a delay time measurement device 20 used for simulation.

FIG. 2 is a schematic diagram of a configuration a delay time measurement device 20 used for simulation.

In FIG. 2, a limiter amplifier 21 receives test transmission data 22 ("MOD_AM" in FIG. 2) which is not delayed and obtains a limiter amplifier output 23 with an even wave height. The limiter amplifier output 23 is branched into two pathways. One of the pathways is for causing no delay on the test transmission data 22 and the other is for causing delay on the test transmission data 22 as it passes through the delay section 24 ("Tdelay" in FIG. 2). Outputs from these pathways are: received by an exclusive OR operation unit 25 ("EX-OR" in FIG. 2) to perform an exclusive OR logical operation thereon; time-averaged by an integrator 26 constituted of a CR; and outputted.

Figure 3:
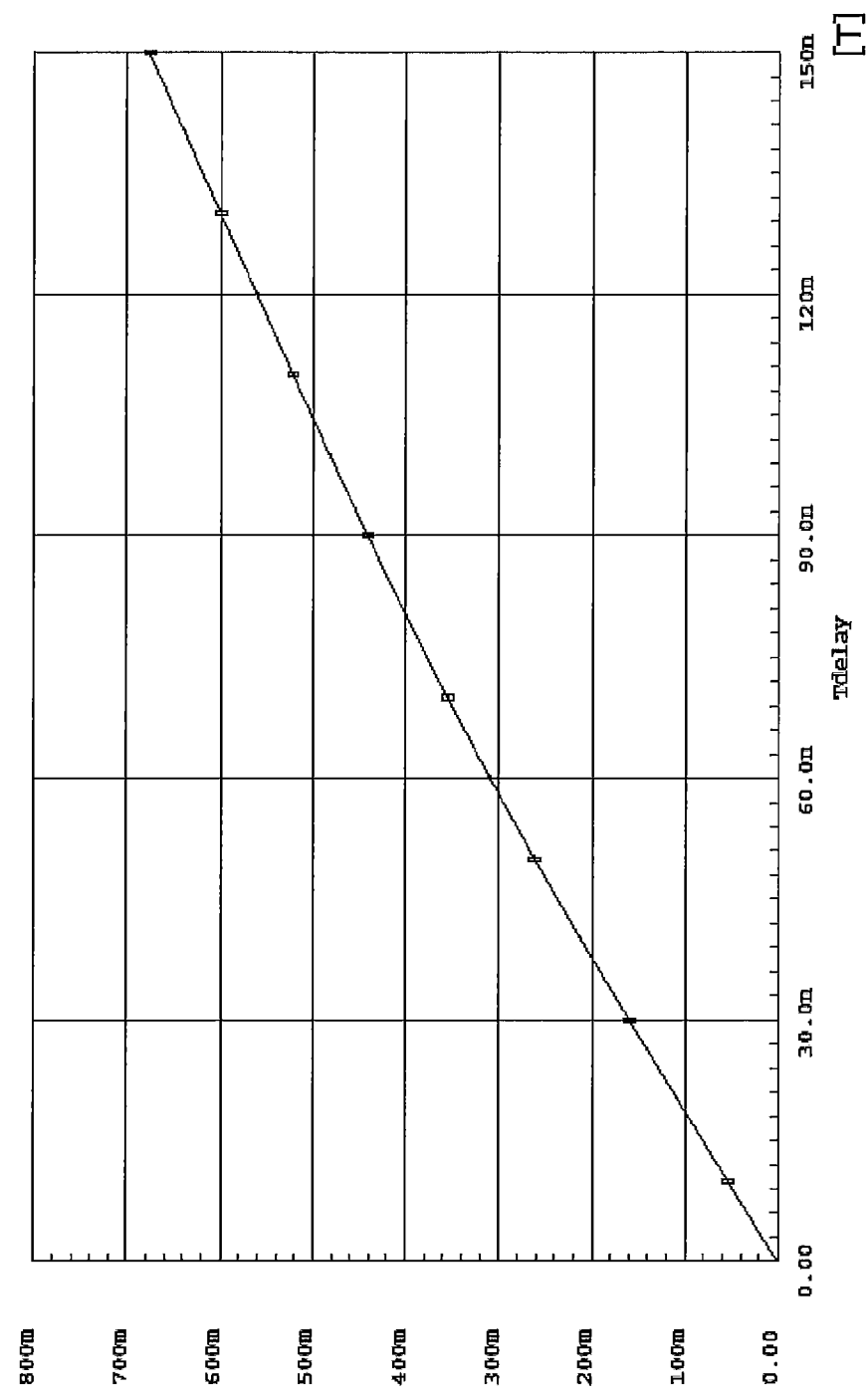
FIG. 3 is a graph illustrating a relationship between a delay time and an output voltage when an output voltage is measured while a delay time caused by a delay section 24 is being changed appropriately in the delay time measurement device 20.

FIG. 3 is a graph illustrating a relationship between a delay time and an output voltage when an output voltage is measured while a delay time caused by the delay section 24 is being changed appropriately in the delay time measurement device 20.

As shown in FIG. 3, the delay time and the output voltage are in a proportional relationship. In the entire range of the delay time of 0 to 150 nsec, the output voltage is about 4.6 mV/nsec, and in a general range of the delay time of 0 to 60 nsec, the output voltage is about 5 mV/nsec.

<Configuration>

Figure 4:
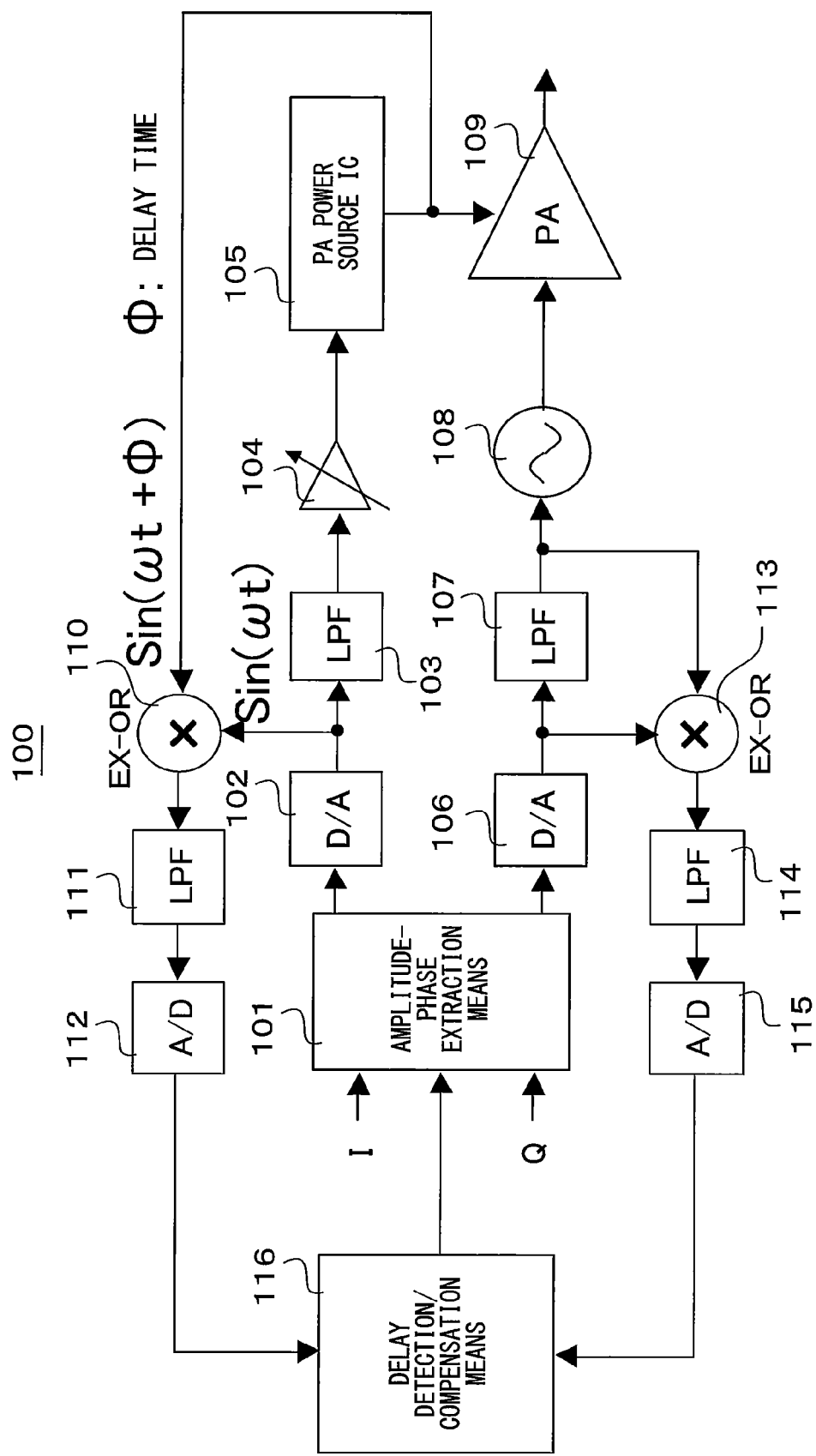
FIG. 4 is a schematic figure illustrating a periphery of a polar modulation circuit of a transmitter 100 according to the first embodiment of the present invention.

FIG. 4 is a schematic figure illustrating a periphery of a polar modulation circuit of a transmitter 100 according to the first embodiment of the present invention.

Based on input signals (an I signal and a Q signal), an amplitude-phase extraction means 101 extracts a digital amplitude component signal and a digital phase component signal and outputs the extracted signals. At this time, based on an amount of lag between an amplitude component and a phase component, which has been measured in advance in a normal environment condition (for example, the room temperature of 25° C., etc.), the amplitude-phase extraction means 101 intentionally shifts an output timing of the digital amplitude component signal and an output timing of the digital phase component signal so that the timing lag between the amplitude component and the phase component can be adjusted and cancelled in a normal environment condition A digital/analog converter 102 ("D/A" in FIG. 4) converts the digital amplitude component signal outputted from the amplitude-phase extraction means 101 to an analog signal.

A low pass filter 103 ("LPF" in FIG. 4) removes an unnecessary high frequency component such as high frequency noise from the amplitude component. A variable gain amplifier 104 adjusts an input level to a PA power source IC105. A DC component of the variable gain amplifier 104 is substantially proportional to a level of an output to be transmitted and an amplitude level of an AC component varies depending on a modulation method (GSM, EDGE, UMTS), and the like.

The PA power source IC105 provides stable power to a PA109 in accordance with an output of the variable gain amplifier 104.

Here, the digital/analog converter 102, the low pass filter 103, the variable gain amplifier 104, and the PA power source IC105 are collectively referred to as a first process means.

A digital/analog converter 106 ("D/A" in FIG. 4) converts the digital phase component signal outputted from the amplitude-phase extraction means 101 to an analog signal.

The low pass filter 107 ("LPF" in FIG. 4) removes an unnecessary high frequency component such as high frequency noise from the phase component.

Here, the low pass filter 107 is referred to as a second process means.

The PLL frequency synthesizer 108 shapes a waveform of a signal inputted to the PA109. Specifically, the PLL frequency synthesizer 108 time-integrates a frequency and converts the frequency to a phase.

The PA109 is a power amplifier, which amplifies an output signal from the PLL frequency synthesizer 108 in accordance with an output level of the PA power source IC105 and thereby synthesizes an amplitude component signal and a phase component signal.

It should be noted that 101 to 109 are example components of a conventional configuration and may be other components of a polar modulation circuit.

An exclusive OR operation means 110 ("EX-OR" in FIG. 4) perform an exclusive OR logical operation between an output of the digital/analog converter 102 and an output of the PA power source IC105. Here, the output of the PA power source IC105 is delayed as an amplitude component outputted by the digital/analog converter 102 has been processed by the first process means including the low pass filter 103, the variable gain amplifier 104, and the PA power source IC105.

The low pass filter 111 ("LPF" in FIG. 4) removes an unnecessary high frequency component from an output signal of the exclusive OR operation means 110 and outputs a voltage that corresponds to a delay time of an amplitude component obtained by time-averaging the output signal.

An analog/digital converter 112 ("A/D" in FIG. 4) converts an analog signal outputted from the low pass filter 111 into a digital signal.

An exclusive OR operation means 113 ("EX-OR" in FIG. 4) performs an exclusive OR logical operation between an output of the digital/analog converter 106 and an output of the low pass filter 107. Here, the output of the low pass filter 107 is delayed as an amplitude component outputted by the digital/analog converter 106 has been processed by the second process means including the low pass filter 107.

A low pass filter 114 ("LPF" in FIG. 4) removes an unnecessary high frequency component from the output signal of the exclusive OR operation means 113 and outputs a voltage that corresponds to a delay time of a phase component obtained by time-averaging the output signal.

An analog/digital converter 115 ("A/D" in FIG. 4) converts an analog signal outputted by the low pass filter 114 into a digital signal.

A delay detection/compensation means 116: obtains a delay time of the amplitude component based on the output of the analog/digital converter 112; obtains a delay time of the phase component based on the output of the analog/digital converter 115; compares each of delay times with the reference value of the amount of lag having been measured in advance in a normal environment condition; detects an amount of delay fluctuation that corresponds to a difference between the reference value and each of the delay times; transmits the amount of delay fluctuation to the amplitude-phase extraction means 101; and causes the amplitude-phase extraction means 101 to correct the amount of lag between the output timing of the digital signal of the amplitude component and the output timing of the digital signal of the phase component in accordance with the amount of delay fluctuation so that the timing lag between the amplitude component and the phase component can be adjusted and cancelled in the current environment condition.

<Summary>

As described above, the transmitter according to the first embodiment measures an actual delay time of amplitude component and an actual delay time of phase component in real time and adjusts and cancels a lag between the delay times of the amplitude component and the phase component. Accordingly, timings of the amplitude component and the phase component are synchronized accurately, thereby increasing accuracy and efficiency of transmission.

Measurement of each delay time and adjustment of an amount of lag can be performed while useful data is being transmitted, and thus do not require extra time. Consequently, synchronization of the timings of the amplitude component and the phase component can be frequently performed, thereby enabling quick adaptation to changes in environment.

Second Embodiment

<Outline>

In the first embodiment, only one of the two signals on which an exclusive OR operation is to be performed passes a low pass filter. Thus, waveforms of the two signals can be different because, for example, the other signal which does not pass the low pass filter includes small pulses, resulting in a possibility of an error.

Therefore, in the second embodiment, both of the signals on which an exclusive OR operation is to be performed pass respective filters having the same characteristics, small pulses and the like which may cause an error are removed while a delay difference is being cancelled. Furthermore, both of the signals pass respective limiter amplifiers having the same characteristics, and only phase information is used so that there is no effect of amplitude information, and thereby measurement error is reduced.

As seen from a graph of the average voltage 18 in FIG. 1, when a number of pulses generated during an accumulation time period varies, output voltages also vary even if the delay time is the same. Accordingly, although there is no problem when test data whose number of pulses is previously known, when useful data is used, an output voltage fluctuates depending on a content of the data, resulting in a possibility of an error.

Therefore, in the present embodiment, a counter is provided for counting a number of pulses, and ΔT is obtained by using the counted number of pulses, and thereby an error depending on a content of data is eliminated.

<Configuration>

Figure 5:
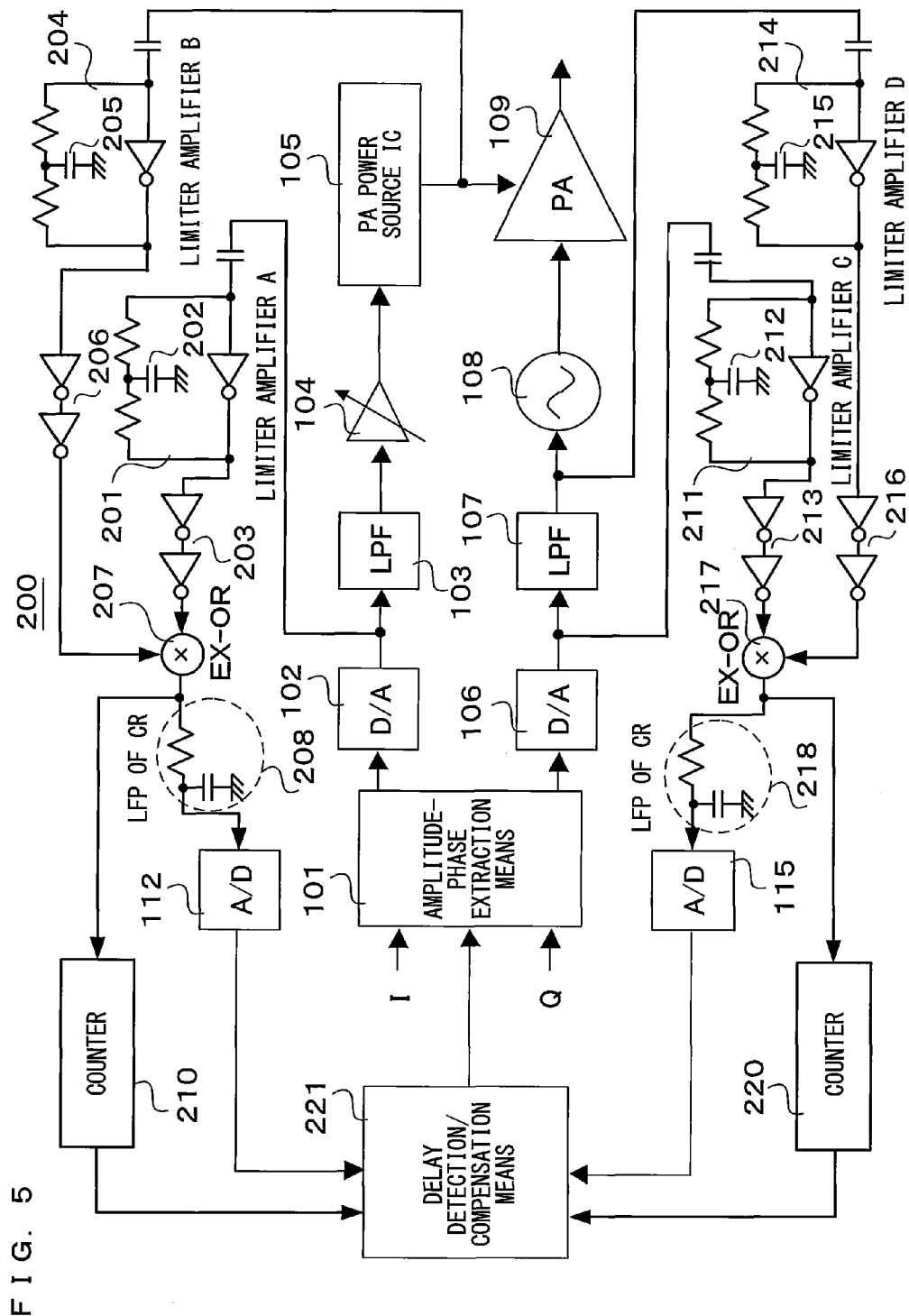
FIG. 5 is a schematic figure illustrating a periphery of a polar modulation circuit of a transmitter 200 according to a second embodiment of the present invention.

FIG. 5 is a schematic figure illustrating a periphery of a polar modulation circuit of a transmitter 200 according to the second embodiment of the present invention.

It should be noted that the same components as those in the first embodiment are denoted by the same reference numerals, and descriptions thereof are omitted.

A limiter amplifier A201 shapes a wave height of a digital amplitude component signal, which is an output of the digital/analog converter 102, so as to have an even height.

A filter 202 and a filter 203 each removes small pulses and the like which may cause an error from the digital amplitude component signal.

A limiter amplifier B204 has the same characteristics as those of the limiter amplifier A201 and delays an output of the PA power source IC105, as it passes therethrough, for the same delay time caused by the limiter amplifier A201.

A filter 205 and a filter 206 have the same characteristics as those of the filter 202 and the same characteristics as those of the filter 203, respectively. The filter 205 and the filter 206 cause the same delay time as the filter 202 and the same delay time as the filter 203, respectively.

An exclusive OR operation means 207 ("EX-OR" in FIG. 5) has substantially the same function as that of the exclusive OR operation means 110 of the first embodiment shown in FIG. 4, and performs an exclusive OR logical operation between an output of the filter 203 and an output of the filter 206.

A low pass filter 208 ("LPF of CR" in FIG. 5) has substantially the same function as that of the low pass filter 111 of the first embodiment shown in FIG. 4, and outputs a voltage that corresponds to a delay time of an amplitude component.

An analog/digital converter 209 ("A/D" in FIG. 5) converts an analog signal outputted from the low pass filter 208 into a digital signal.

A counter 210 counts a number of pulses when a pulse width of an output of the exclusive OR operation means 207 is ΔT. For example, the counter 210 counts, from an output having a waveform as that of the output voltage 16 in FIG. 1, a number of pulses which surpass a voltage of a half of the wave height, when the pulse width is ΔT.

A limiter amplifier C211 shapes a wave height of a digital phase component signal, which is an output of the digital/analog converter 106, so as to have an even height.

A filter 212 and a filter 213 each removes small pulses and the like which may cause an error from the digital phase component signal.

A limiter amplifier D214 has the same characteristics as those of the limiter amplifier C211 and delays an output of the low pass filter 107, as it passes therethrough, for the same delay time caused by the limiter amplifier C211.

A filter 215 and a filter 216 have the same characteristics as those of the filter 212 and the same characteristics as those of the filter 213, respectively. The filter 215 and the filter 216 cause the same delay time as the filter 212 and the same delay time as the filter 213, respectively.

An exclusive OR operation means 217 ("EX-OR" in FIG. 5) has substantially the same function as that of the exclusive OR operation means 113 of the first embodiment shown in FIG. 4, and performs an exclusive OR logical operation between an output of the filter 213 and an output of the filter 216.

A low pass filter 218 ("LPF of CR" in FIG. 5) has substantially the same function as that of the low pass filter 114 of the first embodiment shown in FIG. 4, and outputs a voltage that corresponds to a delay time of a phase component.

An analog/digital converter 219 ("A/D" in FIG. 5) converts an analog signal outputted from the low pass filter 218 into a digital signal.

A counter 220 counts a number of pulses when a pulse width of an output of the exclusive OR operation means 217 is $\Delta T$.

A delay detection/compensation means 221: obtains a delay time of the amplitude component based on an output of the analog/digital converter 209 and the number of pulses counted by the counter 210; obtains a delay time of the phase component based on an output of the analog/digital converter 219 and the number of pulses counted by the counter 220; compares the amount of lag having been measured in advance in a normal environment condition with the reference value; detects an amount of delay fluctuation that corresponds to a difference between the reference value and each of the delay times; transmits the amount of delay fluctuation to the amplitude-phase extraction means 101; and causes the amplitude-phase extraction means 101 to correct the amount of lag between the output timing of the digital signal of the amplitude component and the output timing of the digital signal of the phase component in accordance with the amount of delay fluctuation so that the timing lag between the amplitude component and the phase component can be adjusted and cancelled in the current environment condition.

The counter 210 may count a number of pulses until the number of pulses reaches a first predetermined number and use a voltage that corresponds to the delay time of the amplitude component accumulated in the low pass filter 208 before the number of pulses has reached the first predetermined number. Likewise, the counter 220 may count a number of pulses until the number of pulses reaches a second predetermined number and use a voltage that corresponds to the delay time of the phase component accumulated in the low pass filter 218 before the number of pulses has reached the second predetermined number.

When an output of the low pass filter 208 is "Vout 1", the following formula is satisfied.

$$V\text{out}1=\{(2\times\Delta T1)/T\text{sig\_ave}1\}\times VDD1 \qquad \text{formula 1-1}$$

$$T\text{sig\_ave}1=T\text{measure}1/(\text{number of pulses of amplitude component}/2) \qquad \text{formula 1-2}$$

Here, "$\Delta T1$" is a pulse width of the amplitude component that corresponds to a delay time, and "Tsig_ave1" is an average of the amplitude component during one cycle, "VDD1" is a pulse height of the amplitude component, and "Tmeasure1" is an accumulation time period.

Here, when an output of the low pass filter 218 is "Vout2", the following formula is satisfied.

$$V\text{out}2=\{(2\times\Delta T2)/T\text{sig\_ave}2\}\times VDD2 \qquad \text{formula 2-1}$$

$$T\text{sig\_ave}2=T\text{measure}2/(\text{number of pulses of phase component}/2) \qquad \text{formula 2-2}$$

Here, "$\Delta T2$" is a pulse width of the phase component that corresponds to a delay time, "Tsig_ave2" is an average of the phase component during two cycles, "VDD2" is a pulse height of the phase component, and "Tmeasure2" is an accumulation time period.

The delay detection/compensation means 221 obtains $\Delta T1$ from formula 1-1 and formula 1-2 and thereby obtains a delay time of the amplitude component. The delay detection/compensation means 221 obtains $\Delta T2$ from formula 2-1 and formula 2-2 and thereby obtains a delay time of the phase component.

It should be noted that temperature variation of the CRs of the low pass filters 208, 218 do not affect an accuracy if "Tmeasure2" is long enough; however, it takes time until outputs are stabilized.

<Summary>

As described above, the transmitter according to the second embodiment includes: in addition to the configuration of the first embodiment, substantially equivalent limiter amplifiers which respectively set upper limits on the amplitude and substantially equivalent filters which remove small pulses that may cause an error, for every two inputs of the exclusive OR operation means 207 and every two inputs of the exclusive OR operation means 217, thereby reducing measurement errors.

Further, numbers of pulses of an output of the exclusive OR operation means 207 and an output of the exclusive OR operation means 217 are counted. Then, at a time of obtaining a delay time of the amplitude component, an output of the analog/digital converter 209 is divided by a number of pulses of an output of the exclusive OR operation means 207, and at a time of obtaining a delay time of the phase component, an output of the analog/digital converter 219 is divided by a number of pulses of an output of the exclusive OR operation means 217. Accordingly, an error depending on a content of data can be eliminated.

Third Embodiment

<Outline>

The third embodiment is different from the second embodiment in that the low pass filter 208 and the low pass filter 218 are replaced by integrators.

<Configuration>

Figure 6:
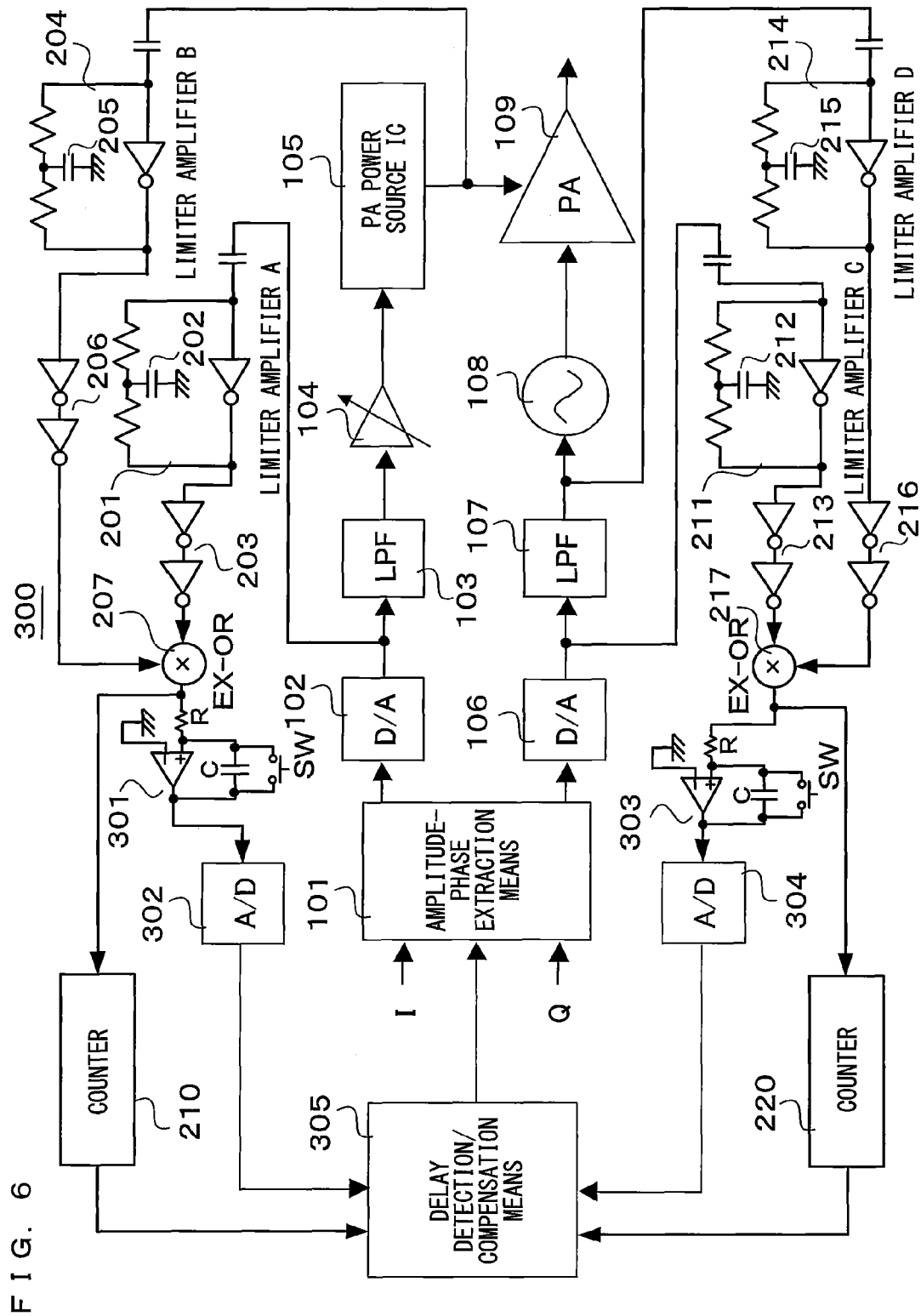
FIG. 6 is a schematic figure illustrating a periphery of a polar modulation circuit of a transmitter 300 according to a third embodiment of the present invention.

FIG. 6 is a schematic figure illustrating a periphery of a polar modulation circuit of a transmitter 300 according to the third embodiment of the present invention.

It should be noted that the same components as those in the second embodiment are denoted by the same reference numerals, and descriptions thereof are omitted.

An integrator 301 integrates pulses of an output of the exclusive OR operation means 207.

An analog/digital converter 302 ("A/D" in FIG. 6) converts an analog signal outputted from the integrator 301 into a digital signal.

An integrator 303 integrates pulses of an output of the exclusive OR operation means 217.

An analog/digital converter 304 ("A/D" in FIG. 6) converts an analog signal outputted from the integrator 303 into a digital signal.

A delay detection/compensation means 305: obtains a delay time of the amplitude component based on the output of an analog/digital converter 302 and the number of pulses counted by the counter 210; obtains a delay time of the phase component based on an output of the analog/digital converter 304 and the number of pulses counted by the counter 220; compares the amount of lag having been measured in advance in a normal environment condition with the reference value; detects an amount of delay fluctuation that corresponds to a difference between the reference value and each of the delay times; transmits the amount of delay fluctuation to the amplitude-phase extraction means 101; and causes the amplitude-phase extraction means 101 to correct the amount of lag between the output timing of the digital signal of the amplitude component and the output timing of the digital signal of the phase component in accordance with the amount of delay fluctuation so that the timing lag between the amplitude component and the phase component can be adjusted and cancelled in the current environment condition.

"SW" in the integrator 301 and the integrator 303 are each a reset switch.

Here, when an output of the integrator 301 is "Vout 1", the following formula is satisfied.

$$Vout1 = -\{1/(C \times R)\} \times (\text{number of pulses of amplitude component } \Delta T1 \times VDD1) \quad \text{formula 1}$$

Here, $\Delta T1$ corresponds to a pulse width that corresponds to a delay time of the amplitude component, VDD1 is a pulse height of the amplitude component,
C is a capacity of the capacitor in the integrator, and
R is a resistance value in the integrator.

An output Vout2 of the integrator 303 is represented as follows.

$$Vout2 = -\{1/(C \times R)\} \times (\text{number of pulses of amplitude component} \times \Delta T2 \times VDD2) \quad \text{formula 2}$$

Here, "$\Delta T2$" is a pulse width of the amplitude component that corresponds to a delay time, "VDD2" is a pulse height of the amplitude component, "C" is a capacity of the capacitor in the integrator, and "R" is a resistance value in the integrator.

The delay detection/compensation means 305 obtains $\Delta T1$ from formula 1 and thereby obtains a delay time of the amplitude component, and obtains $\Delta T2$ from formula 2 and thereby obtains a delay time of the phase component.

<Summary>

As described above, the transmitter according to the third embodiment integrates an output of the exclusive OR operation means by using the integrator, and thus there may be an effect of the CR of the integrator due to temperature variation. However, when compared with the second embodiment, accuracy is improved as "Tsig_ave1" and "Tsig_ave2" need not be measured and there is a little chance of being affected by noise as the output voltage is high.

Fourth Embodiment

<Outline>

The fourth embodiment includes both of a polar modulation circuit and an orthogonal modulation circuit, which: performs a modulation process in both of the circuits in parallel, extracts an amplitude component and a phase component from each of outputs of both of the circuits, respectively; detects, with reference to an amplitude component of a phase component in the orthogonal modulation circuit, an amount of lag between an amplitude component and a phase component in the polar modulation circuit; provides a feedback to an amplitude-phase extraction means of the polar modulation circuit; and adjusts output timings of the amplitude component and the phase component so that the lag is cancelled.

<Configuration>

FIG. 7 is a schematic figure illustrating a periphery of a polar modulation circuit of a transmitter 400 according to the fourth embodiment of the present invention.

A polar modulation circuit 401 is a polar modulation circuit having a conventional configuration, which corresponds to 101 to 109 of the first embodiment shown in FIG. 4 and outputs an output signal "RF_main".

An orthogonal modulation circuit 402 has a conventional configuration and modulates an amplitude component signal and a phase component signal without separating these signals, and outputs an output signal "RF_dummy".

It should be noted that the orthogonal modulation circuit 402 may be another modulation circuit as far as it adopts a modulation method that does not cause a lag between the amplitude component and the phase component.

A limiter 403 shapes a wave height of the output signal "RF_main" of the polar modulation circuit 401 so as to have an even height and converts the output signal "RF_main" into a signal including only the phase component.

An AM wave detector 404 extracts an envelope component of the output signal "RF_main" of the polar modulation circuit 401 and converts the envelope component into a signal including only the amplitude component.

A limiter 405 shapes a wave height of an output signal "RF_dummy" of the orthogonal modulation circuit 402 so as to have an even height and converts the output signal "RF_dummy" into a signal including only the phase component.

An AM wave detector 406 extracts an envelope component of the output signal "RF_dummy" of the orthogonal modulation circuit 402 and converts the envelope component into a signal including only the amplitude component.

A delay detection/compensation means 407 recognizes appropriate timings of the amplitude component and the phase component based on the output of the AM wave detector 406 and the output of the limiter 405, detects an amount of delay fluctuation that corresponds to an amount of lag between the output of the AM wave detector 404 and the output of the limiter 403, transmits the amount of delay fluctuation to the polar modulation circuit 401 (component that corresponds to the amplitude-phase extraction means 101 of the first embodiment), corrects the amount of lag between an output timing of the digital amplitude component signal and an output timing of the digital phase component signal in accordance with the amount of delay fluctuation, and adjusts the timing lag between amplitude component and the phase component so as to cancel the lag in the present environment condition. Specifically, the delay detection/compensation means 407 performs an exclusive OR logical operation ("EX-OR_A" in FIG. 7) between the output of the AM wave detector 404 and the output of the AM wave detector 406, outputs a voltage corresponding to a time difference of amplitude component by a low pass filter ("LPF_A" in FIG. 7), and converts the voltage into a digital signal by an analog/digital converter ("A/D_A" in FIG. 7) and thereby obtains a difference between a time required for processing the amplitude component in the polar modulation circuit 401 and a time required for processing the amplitude component in the orthogonal modulation circuit 402. Further, the delay detection/compensation means 407 performs an exclusive OR logical operation ("EX-OR_B" in FIG. 7) between the output of the limiter 403 and the output of the limiter 405, outputs a voltage corresponding to a time difference of the phase component by a low pass filter ("LPF_B" in FIG. 7), converts the voltage into a digital signal by an analog/digital converter ("A/D_B" in FIG. 7), and obtains a difference between a time required for processing the phase component in the polar modulation circuit 401 and a time required for processing the phase component in the orthogonal modulation circuit 402. Lastly, the delay detection/compensation means 407 calculates a "difference" between the difference of the amplitude component and the difference of the phase component and thereby obtains an amount of lag between a time required for processing the amplitude component and a time required for processing the phase component in the polar modulation circuit 401.

Here, a difference between a signal processing time of the polar modulation circuit 401 and a signal processing time of the orthogonal modulation circuit 402 relating to the amplitude component, corresponds to a delay time caused by the first process means of the first embodiment. Likewise, a difference between a signal processing time of the polar modulation circuit 401 and a signal processing time of the orthogonal modulation circuit 402 relating to the phase component, corresponds to a delay time caused by the second process means of the first embodiment.

<Summary>

As described above, according to the features of the transmitter according to the fourth embodiment, with reference to a result of the modulation process of the orthogonal modulation circuit for the same input signal, a result of the modulation process of the polar modulation circuit is evaluated, and a feedback is provided. Accordingly, timings of the amplitude component and the phase component are synchronized accurately, thereby increasing accuracy and efficiency of transmission.

Further, it is a premise that an output signal of the polar modulation circuit is basically used as a valid signal, and the orthogonal modulation circuit does not require a costly complicated circuit with superior characteristics, and thus reduction in cost can be expected. Furthermore, the orthogonal modulation circuit only has to operate when timing of the amplitude component and the phase component in the polar modulation circuit are synchronized, and thus reduction in power consumption can be expected.

Fifth Embodiment

<Outline>

In the present embodiment, a modulation process is performed in an orthogonal modulation circuit, and an amplitude component and a phase component are extracted from an output. One of the amplitude component and the phase component (normally, the phase component), whose delay time is less than that of the other, is delayed. A modulation process is performed in a polar modulation circuit, and with reference to the amplitude component and the phase component before polar modulation, an amount of lag between the amplitude component and the phase component after polar modulation is detected and the delay amount is adjusted so that the lag is cancelled.

<Configuration>

Figure 8:
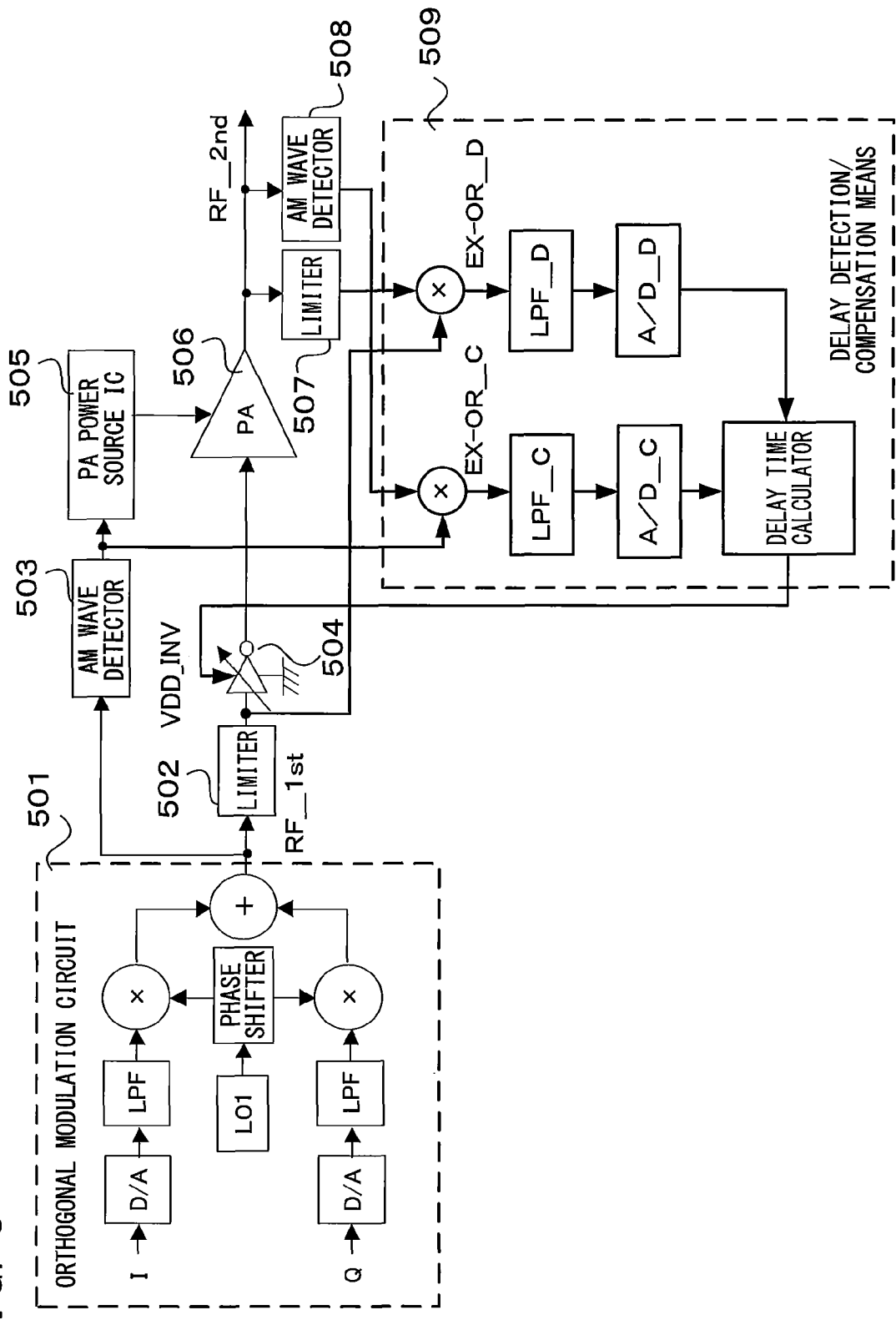
FIG. 8 is a schematic figure illustrating periphery circuitry of a polar modulation circuit of a transmitter 500 according to a fifth embodiment of the present invention.

FIG. 8 is a schematic figure illustrating peripheral circuit of a polar modulation circuit of a transmitter 500 according to a fifth embodiment of the present invention.

An orthogonal modulation circuit 501 has a conventional configuration and modulates an amplitude component signal and a phase component signal without separating these signals, and outputs an output signal "RF_1st".

It should be noted that the orthogonal modulation circuit 501 may be another modulation circuit as far as it adopts a modulation method that does not cause a lag between the amplitude component and the phase component.

A limiter 502 shapes a wave height of the output signal "RF_1st" of the orthogonal modulation circuit 501 so as to have an even height and converts the output signal "RF_1st" into a signal including only the phase component.

An AM wave detector 503 extracts an envelope component of the output signal "RF_1st" of the orthogonal modulation circuit 402 and converts envelope component into a signal including only the amplitude component.

Preferably, the limiter 502 and the AM wave detector 503 may have characteristics that can cancel each other's effect due to delay temperature fluctuation.

A variable delay unit 504 delays the signal including only the phase component outputted from the limiter 502 intentionally so that an output thereof is different from an output of the signal including only the amplitude component from the AM wave detector 503, and thereby cancels a timing lag between the amplitude component and the phase component.

A PA power source IC505 provides stable power to a PA506 in accordance with the output of the AM wave detector 503.

The PA506 is a power amplifier, which amplifies an output signal of the variable delay unit 504 in accordance with an output level of the PA power source IC505, thereby synthesizes an amplitude component signal and a phase component signal, and outputs an output signal "RF_2 nd".

A limiter 507 shapes a wave height of the output signal "RF_2nd" of the PA506 and converts the output signal of the PA506 into a signal including only the phase component.

An AM wave detector 508 extracts an envelope component of the output signal "RF_2nd" of the PA506 and converts the envelope component into a signal including only the amplitude component.

Preferably, the limiter 507 and the AM wave detector 508 may have characteristics that cancel each other's effect due to delay temperature fluctuation.

A delay detection/compensation means 509: recognizes appropriate timings of the amplitude component and the phase component based on the output of the AM wave detector 503 and the output of the limiter 502; detects an amount of delay fluctuation that corresponds to an amount of lag between the output of the AM wave detector 508 and the output of the limiter 507; adjusts a delay amount of the variable delay unit 504 in accordance with the amount of delay fluctuation; corrects an amount of lag between an output timing of the amplitude component signal and an output timing of the phase component signal; and adjusts a timing lag between the amplitude component and the phase component in the current environment condition.

Specifically, the delay detection/compensation means 509 performs an exclusive OR logical operation ("EX-OR_C" in FIG. 8) between the output of the AM wave detector 503 and the output of the AM wave detector 508, outputs a voltage corresponding to a time difference of amplitude component by a low pass filter ("LPF_C" in FIG. 8), and converts the voltage into a digital signal by an analog/digital converter ("A/D_C" in FIG. 8) and thereby obtains a time required for processing the amplitude component during polar modulation. Further, the delay detection/compensation means 509 performs an exclusive OR logical operation ("EX-OR_D" in FIG. 8) between the output of the limiter 502 and the output of the limiter 507, outputs a voltage corresponding to a time difference of phase component by a low pass filter ("LPF_D" in FIG. 8), and converts the voltage into a digital signal by an analog/digital converter ("A/D_D" in FIG. 8) and thereby obtains a time required for processing the phase component during polar modulation. Lastly, the delay detection/compensation means 509 calculates a "difference" between the time required for processing the amplitude component and the time required for processing the phase component and thereby obtains an amount of lag between the time required for processing the amplitude component and the time required for processing the phase component during polar modulation.

Here, the PA power source IC 505, the PA 506, and the AM wave detector 508 correspond to the first process means of the first embodiment. The output of the AM wave detector 508 is delayed as the amplitude component of the output signal "RF_1st" outputted from the AM wave detector 503 has been processed by the first process means including the PA power source IC 505, the PA 506, and the AM wave detector 508. Further, the variable delay unit 504, the PA 506, and the limiter 507 correspond to the second process means of the first embodiment. The output of the limiter 507 is delayed as the phase component of the output signal "RF_1st" outputted from the limiter 502 has been processed by the second process means including the variable delay unit 504, the PA 506, and the limiter 507.

<Summary>

As described above, according to the transmitter according to the fifth embodiment, with reference to a result of a modulation process of the first stage in an orthogonal modulation circuit, a result of a modulation process of a polar modulation circuit of the second stage is evaluated, and feedback is provided. Accordingly, timings of the amplitude component and the phase component can be synchronized accurately, thereby increasing accuracy and efficiency of transmission.

Further, it is a premise that an output signal of the polar modulation circuit is basically used as a valid signal, and the orthogonal modulation circuit does not require a costly complicated circuit with superior characteristics. Accordingly, reduction in cost can be expected.

INDUSTRIAL APPLICABILITY

The transmitter including a polar modulation circuit of the present invention is applicable to any communication apparatus, and is capable of reducing an adverse effect due to environmental changes such as temperature variations and increasing accuracy and efficiency of transmission. Accordingly, the present invention is suitable for general-purpose mobile equipment such as mobile phones with respect to which reduction in cost and reduction in power consumption are expected.

DESCRIPTION OF THE REFERENCE CHARACTERS 10 delay time measurement device
11, 12 limiter amplifier
13, 14 limiter amplifier output
15 exclusive OR operation unit
16 output voltage
17 low pass filter
18 average voltage
20 delay time measurement device
21 limiter amplifier
22 test transmission data
23 limiter amplifier output
24 delay section
25 exclusive OR operation unit
26 integrator
100 transmitter
101 amplitude-phase extraction means
102 digital/analog converter
103 low pass filter
104 variable gain amplifier
105 PA power source IC
106 digital/analog converter
107 low pass filter
108 PLL frequency synthesizer
109 PA
110 exclusive OR operation means
111 low pass filter
112 analog/digital converter
113 exclusive OR operation means
114 low pass filter
115 analog/digital converter
116 delay detection/compensation means
200 transmitter
201 limiter amplifier A
202, 203 filter
204 limiter amplifier B
205, 206 filter
207 exclusive OR operation means
208 low pass filter
209 analog/digital converter
210 counter
211 limiter amplifier C
212, 213 filter
214 limiter amplifier D
215, 216 filter
217 exclusive OR operation means
218 low pass filter
219 analog/digital converter
220 counter
221 delay detection/compensation means
300 transmitter
301 integrator
302 analog/digital converter
303 integrator
304 analog/digital converter
305 delay detection/compensation means
400 transmitter
401 polar modulation circuit
402 orthogonal modulation circuit
403 limiter
404 AM wave detector
405 limiter
406 AM wave detector
407 delay detection/compensation means
500 transmitter
501 orthogonal modulation circuit
502 limiter
503 AM wave detector
504 variable delay unit
505 PA power source IC
506 PA
507 limiter
508 AM wave detector
509 delay detection/compensation means

The invention claimed is:

1. A transmitter including a polar modulation circuit, wherein the polar modulation circuit comprises:
   an extraction section configured to extract an amplitude component and a phase component separately from an input signal;
   a first processing section configured to perform a first signal process which causes a delay on the amplitude component extracted by the first extraction section;

a second processing section configured to perform a second signal processing which causes a delay on the phase component extracted by the first extraction section;

an amplifier configured to synthesize an output of the first processing section and an output of the second processing section and amplify the synthesized outputs to generate an output signal;

a first calculator configured to perform an exclusive OR logical operation between the amplitude component before being inputted to the first processing section and the amplitude component after having been inputted to the first processing section;

a first accumulation section configured to accumulate outputs of the first calculator for a predetermined time period;

a second calculator configured to perform an exclusive OR logical operation between the phase component before being inputted to the second processing section and the phase component after having been inputted to the second processing section;

a second accumulation section configured to accumulate outputs of the second calculator for a predetermined time period; and a delay fluctuation detection/compensation section configured to: obtain a delay time of the amplitude component based on an amount of accumulation of the first accumulation section; obtain a delay time of the phase component based on an amount of accumulation of the second accumulation section; detect an amount of delay fluctuation by using the delay times; and adjust, in accordance with the amount of delay fluctuation, timings of the amplitude component and the phase component before being synthesized by the amplifier.

2. The transmitter according to claim 1, wherein the polar modulation circuit further comprises substantially equivalent limiter amplifiers configured to respectively set upper limits on the amplitude for every two inputs of the first calculator and every two inputs of the second calculator.

3. The transmitter according to claim 1, wherein the polar modulation circuit further comprises substantially equivalent filters configured to remove small pulses that may cause an error for every two inputs of the first calculator and for every two inputs of the second calculator.

4. The transmitter according to claim 1, wherein the polar modulation circuit further comprises:
 a first counter configured to count a number of pulses of an output of the first calculator; and
 a second counter configured to count a number of pulses of an output of the second calculator, and
 the delay fluctuation detection/compensation section,
  at a time of obtaining a delay time of the amplitude component, divides an output of the first accumulation section by the number of pulses counted by the first counter, and
  at a time of obtaining a delay time of the phase component, divides an output of the second accumulation section by the number of pulses counted by the second counter.

5. The transmitter according to claim 4, wherein the first accumulation section accumulates outputs of the first calculator until the number of pulses counted by the first counter reaches a first predetermined number, and the second accumulation section accumulates outputs of the second calculator until the number of pulses counted by the second counter reaches a second predetermined number.

6. The transmitter according to claim 4, wherein
the first accumulation section and the second accumulation section are a low pass filter circuit including a capacitor and a resistance, and
an output Vout1 of the first accumulation section is represented by:

$$V\text{out1} = \{(2\Delta T1)/T\text{sig\_ave1}\} \times VDD1 \quad \text{formula 1-1}$$

$$T\text{sig\_ave1} = T\text{measure1}/(\text{number of pulses of amplitude component}/2) \quad \text{formula 1-2}$$

here, $\Delta T1$ is a pulse width of the amplitude component that corresponds to a delay time,
Tsig_ave1 is an average of the amplitude component during one cycle,
VDD1 is a pulse height of the amplitude component,
Tmeasure1 is an accumulation time period, and
an output Vout2 of the second accumulation section is represented by:

$$V\text{out2} = \{(2\Delta T2)/T\text{sig\_ave2}\} \times VDD2 \quad \text{formula 2-1}$$

$$T\text{sig\_ave2} = T\text{measure2}/(\text{number of pulses of phase component}/2) \quad \text{formula 2-2}$$

here, $\Delta T2$ is a pulse width of the phase component that corresponds to a delay time,
Tsig_ave2 is an average of the phase component during two cycles,
VDD2 is a pulse height of the phase component,
Tmeasure2 is an accumulation time period, and
the delay fluctuation detection/compensation section: obtains $\Delta T1$ from formula 1-1 and formula 1-2 and thereby obtains a delay time of the amplitude component; and obtains $\Delta T2$ from formula 2-1 and formula 2-2 and thereby obtains a delay time of the phase component.

7. The transmitter according to claim 4, wherein
the first accumulation section and the second accumulation section are each an integrator, and
an output Vout1 of the first accumulation section is represented by:

$$V\text{out1} = -\{1/(C \times R)\} \times (\text{number of pulses of amplitude component} \times \Delta T1 \times VDD1) \quad \text{formula 1}$$

here, $\Delta T1$ is a pulse width of the amplitude component that corresponds to a delay time,
VDD1 is a pulse height of the amplitude component,
C is a capacity of the capacitor in the integrator,
R is a resistance value in the integrator, and
an output Vout2 of the second accumulation section is represented by:

$$V\text{out2} = -\{1/(C \times R)\} \times (\text{number of pulses of amplitude component} \times \Delta T2 \times VDD2) \quad \text{formula 2}$$

here, $\Delta T2$ is a pulse width of the amplitude component that corresponds to a delay time,
VDD2 is a pulse height of the amplitude component,
C is a capacity of the capacitor in the integrator, and
R is a resistance value in the integrator, and
the delay fluctuation detection/compensation section: obtains $\Delta T1$ from formula 1 and thereby obtains a delay time of the amplitude component; and obtains $\Delta T2$ from formula 2 and thereby obtains a delay time of the phase component.

8. The transmitter according to claim 1, further comprising another modulation circuit which: modulates an I signal and a Q signal without separating an amplitude component signal and a phase component signal; generates a modulation signal that does not cause a lag between the amplitude component and the phase component; and provides the modulation signal as an input signal to the polar modulation circuit.

9. The transmitter according to claim 1, further comprising another modulation circuit which: modulates an I signal and a Q signal without separating an amplitude component signal and a phase component signal; generates a modulation signal that does not cause a lag between the amplitude component and the phase component; extracts the amplitude component and the phase component separately from the modulation signal; provides the extracted amplitude component to replace with a signal yet to be inputted to the first processing section in the first calculator; and provides the extracted phase component to replace with a signal yet to be inputted to the second processing section in the second calculator.

* * * * *